US011644798B2

(12) United States Patent
Perenzoni

(10) Patent No.: US 11,644,798 B2
(45) Date of Patent: May 9, 2023

(54) POWER SUPPLY CIRCUIT MODULE FOR TDC AND CALIBRATION METHOD OF SAID POWER SUPPLY CIRCUIT MODULE

(71) Applicant: FONDAZIONE BRUNO KESSLER, Trento (IT)

(72) Inventor: Matteo Perenzoni, Trento (IT)

(73) Assignee: FONDAZIONE BRUNO KESSLER, Trento (IT)

( * ) Notice: Subject to any disclaimer, the term of this patent is extended or adjusted under 35 U.S.C. 154(b) by 0 days.

(21) Appl. No.: 17/617,841

(22) PCT Filed: Apr. 28, 2020

(86) PCT No.: PCT/IB2020/053977
§ 371 (c)(1),
(2) Date: Dec. 9, 2021

(87) PCT Pub. No.: WO2020/250050
PCT Pub. Date: Dec. 17, 2020

(65) Prior Publication Data

US 2022/0236695 A1 Jul. 28, 2022

(30) Foreign Application Priority Data

Jun. 13, 2019 (IT) ........................ 102019000008793

(51) Int. Cl.
*H03M 1/50* (2006.01)
*G04F 10/00* (2006.01)

(52) U.S. Cl.
CPC .................................. *G04F 10/005* (2013.01)

(58) Field of Classification Search
CPC .................................................... G04F 10/005
USPC ........................................................ 341/166
See application file for complete search history.

(56) References Cited

U.S. PATENT DOCUMENTS 6,654,263 B2 * 11/2003 Kurotsu .................. H02M 3/07 363/60
6,897,713 B1 5/2005 Nguyen et al.
8,253,279 B2 * 8/2012 Pons ...................... A61N 1/025 607/2

(Continued)

FOREIGN PATENT DOCUMENTS

CN 101006711 A 7/2007
CN 104300970 A 1/2015

(Continued)

*Primary Examiner* — Jean B Jeanglaude
(74) *Attorney, Agent, or Firm* — Nath, Goldberg & Meyer; Jerald L. Meyer

(57) ABSTRACT

A power supply circuit module for a TDC (Time to Digital Converter) includes a first input for receiving a control signal, a second input for receiving a power supply voltage, and an output configured to be connected to the power supply input of the TDC. An active main power supply device is configured to receive the control signal at the input and to contribute on the value of the power supply voltage resulting at an output by a voltage value lower than a first predefined percentage with respect to the nominal power supply voltage. A number N of active secondary power supply devices each are configured to contribute on the value of the power supply voltage resulting at the output by a percentage different from the remaining active secondary power supply devices.

10 Claims, 5 Drawing Sheets

(56) References Cited

U.S. PATENT DOCUMENTS

| | | | | |
|---|---|---|---|---|
| 8,766,612 | B2 * | 7/2014 | Mei | H02M 3/156 323/282 |
| 8,884,596 | B2 * | 11/2014 | Li | H03F 3/45183 323/284 |
| 9,627,968 | B2 * | 4/2017 | Tadamasa | H02M 3/156 |
| 2002/0153869 | A1 * | 10/2002 | Kurotsu | H02M 3/07 323/288 |
| 2010/0274301 | A1 * | 10/2010 | Pons | A61N 1/378 607/2 |
| 2012/0256609 | A1 * | 10/2012 | Mei | H02M 3/156 323/282 |
| 2012/0280669 | A1 * | 11/2012 | Li | H03F 3/45183 323/284 |
| 2016/0344288 | A1 * | 11/2016 | Tadamasa | H02M 1/36 |
| 2018/0351558 | A1 | 12/2018 | Kuo et al. | |

FOREIGN PATENT DOCUMENTS

| | | | |
|---|---|---|---|
| CN | 105897258 | A | 8/2016 |
| CN | 107453757 | A | 12/2017 |
| CN | 107797442 | A | 3/2018 |
| EP | 2818946 | A1 | 12/2014 |
| JP | 2008503084 | A | 1/2008 |
| JP | 2018019152 | A | 2/2018 |

* cited by examiner

POWER SUPPLY CIRCUIT MODULE FOR TDC AND CALIBRATION METHOD OF SAID POWER SUPPLY CIRCUIT MODULE

The invention concerns a power supply circuit module for a TDC (Time to Digital Converter), in particular for the computational component of said TDC dedicated to the definition of time intervals, said power supply circuit module being able to correct the power supply voltage value delivered to said TDC based on the variation of the operating conditions and therefore being able to carry out a speed control of the TDC.

The invention also relates to a circuit architecture comprising a plurality of TDC devices each of which is associated with a power supply circuit module according to the invention.

Furthermore, the invention relates to two types of circuit regulators comprising a PLL (Phase locked loop) device operatively associated with the aforesaid circuit architecture.

Finally, the invention concerns a successive approximation calibration method to adequately define the power supply voltage value that the power supply circuit module of the invention must deliver to a relative TDC.

In the sector of microelectronics, in particular of integrated circuits (IC), the use of a circuit device called TDC or "Time to Digital Converter" in order to convert a specific time interval to a digital value is known.

In short, these devices receive a start and a stop signal at the input which respectively represent the beginning and the end of the aforesaid time interval to be measured. Furthermore, the TDCs are internally provided with timing signals so that the same devices are able to count the number of such timing signals that occur in succession during the aforesaid time interval between the start signal and the stop signal in order to deliver at the output the digital value obtained following this count.

It is equally known that said TDC devices must be properly referenced and calibrated before they can be used to perform the conversion of this time interval to a relative digital value.

In particular, said referencing operation has the purpose of making the aforesaid TDC devices work in such a way that, when a start signal and a stop signal are delivered at the input that are distant in time between them over a period equal to a single period of the periodic reference signal or Clock delivered at the input to the circuit architecture to which the aforesaid TDCs belong, the latter are able to deliver at the output a digital value equal to their full scale, the value of which depends on the resolution of the devices themselves.

It is known that, ideally, such referencing is substantially obtained, with a first type of TDC of the prior art, when a power supply voltage of a value equal to the nominal power supply voltage predefined or identified for the specific TDC used is delivered to the same TDC, in particular to the ring-oscillator.

In fact, it is known that the value of the power supply voltage delivered to the input of the TDC determines, with a monotonic function, the operating speed of the TDC itself. Therefore ideally, as previously mentioned, by delivering to the TDC a power supply voltage of a value equal to the predefined nominal power supply voltage, it is expected to obtain a digital signal equal to the full scale at the output, when the aforesaid start and stop signals are distant in time between them over a period equal to the aforesaid single period of the periodic reference signal.

As regards said predefined nominal power supply voltage, among other things, its value depends on the circuit architecture of the specific TDC model used. Therefore, ideally, two TDC devices implemented with the same circuit architecture should theoretically require the same nominal power supply voltage.

However, in practice, both due to constructive issues intrinsic to the TDC and due to conditions external to the device, such as for example the variation in the temperature of the environment in which the same device operates or other types of external noise, the actual nominal power supply voltage to be delivered to the single TDC, in order to obtain a perfect alignment between the periodic reference signal and its full scale, can deviate from the nominal voltage value established a priori.

Therefore, for each single TDC device, depending on its actual physical structure and its electrical behaviour and/or depending on external conditions, it is necessary to identify and deliver a specific power supply voltage value in order to obtain an alignment as precise as possible between the period of the periodic reference signal and the full scale of the aforesaid TDC.

Incidentally, it should be noted that, as an alternative to the referencing of the TDC obtained by means of the power supply voltage delivered to the same, the prior art provides that said operation can be obtained by delivering to a TDC, suitably configured, a control voltage that is distinct from the aforesaid power supply voltage. In this case, the power supply voltage delivered to the TDC is set at the nominal power supply value of the TDC itself.

It is also known that in applications where it is required to convert a time interval to a digital value, such as for example in the case of optical sensors configured to detect the so-called Time of Flight (ToF) of the single photons belonging to a light beam, the joint use of a plurality of TDCs, in the extreme case of a TDC for each sensitive element of the sensor itself, is envisaged.

Typically, in such applications the TDCs are made with the same architecture, therefore, ideally, as mentioned above, the nominal power supply voltage to be used should be the same for all the aforesaid TDCs.

In this sense, a first solution of the prior art provides to deliver a single power supply voltage to all the TDCs belonging to the same sensor, generated by a replica of the control signal placed at the input to the TDC used as PLL.

Said solution, on average, in fact allows the plurality of TDCs to operate at the same speed, that is, to present their full scale on average aligned with the periodic reference signal.

However, considering the single TDC, the latter has some non-uniformities due to the reasons set out above.

Therefore, said single nominal power supply voltage does not prove adequate for obtaining a high operating precision for each single TDC.

To overcome said drawback of the approach described above, one of the known techniques provides to perform an off-line calibration which however requires an expensive computational cost and a high use of memory.

Alternatively, a different known technique provides to deliver at the input to each of the TDCs belonging to the same sensor a specific power supply voltage for the physical characteristics and the electrical behaviour of the same device.

More precisely, the prior art provides for the use of a DAC device (Digital to Analog Converter) in feedback to each single TDC in order to adapt the aforesaid single power supply voltage delivered to the plurality of TDCs to the specific response of each TDC obtained with this feedback. However, this solution has various drawbacks.

Firstly, the presence of a DAC increases the probability of increasing the noise value with respect to the signal.

Furthermore, the fact of having to provide a DAC for each TDC disadvantageously leads to the need to occupy more space in the semiconductor for the control circuit. Therefore, this solution disadvantageously leads to an increase in the size of the Chip itself or, with the same size, a decrease in the so-called Fill-Factor of the sensor.

The present invention intends to overcome all the mentioned drawbacks.

In particular, one of the objects of the invention is to realise a power supply circuit module for TDC and to propose a calibration method for said module, which allow to define as precisely as possible the power supply voltage for the single TDC in a neighbourhood of the nominal power supply voltage, regardless of the other TDCs present in the same device.

Another object of the invention is the realisation of a power supply circuit module and the implementation of a calibration method of said module which allow to dynamically adapt the value of the nominal power supply voltage of each TDC when the operating conditions extrinsic and intrinsic to the device itself vary.

Said objects are achieved with the realisation of the power supply circuit module according to the main claim.

Further characteristics of the power supply circuit module of the invention are described in the dependent claims.

The circuit architecture comprising a plurality of TDC devices, each of which is associated with a power supply circuit module of the invention, according to claim 7, and two alternative types of circuit regulators comprising a PLL device (Phase locked loop) and said circuit architecture, according to claims 8 and 9 respectively, are also part of the invention.

Said objects are also achieved by the calibration method of the power supply circuit module of the invention, according to claim 10.

The aforesaid objects, together with the advantages that will be mentioned hereinafter, will be highlighted during the description of a preferred embodiment of the invention, which is given by way of non-limiting example with reference to the accompanying drawings, where:

FIG. 1 schematically represents the power supply circuit module of the invention connected to a TDC;

Figure 5:
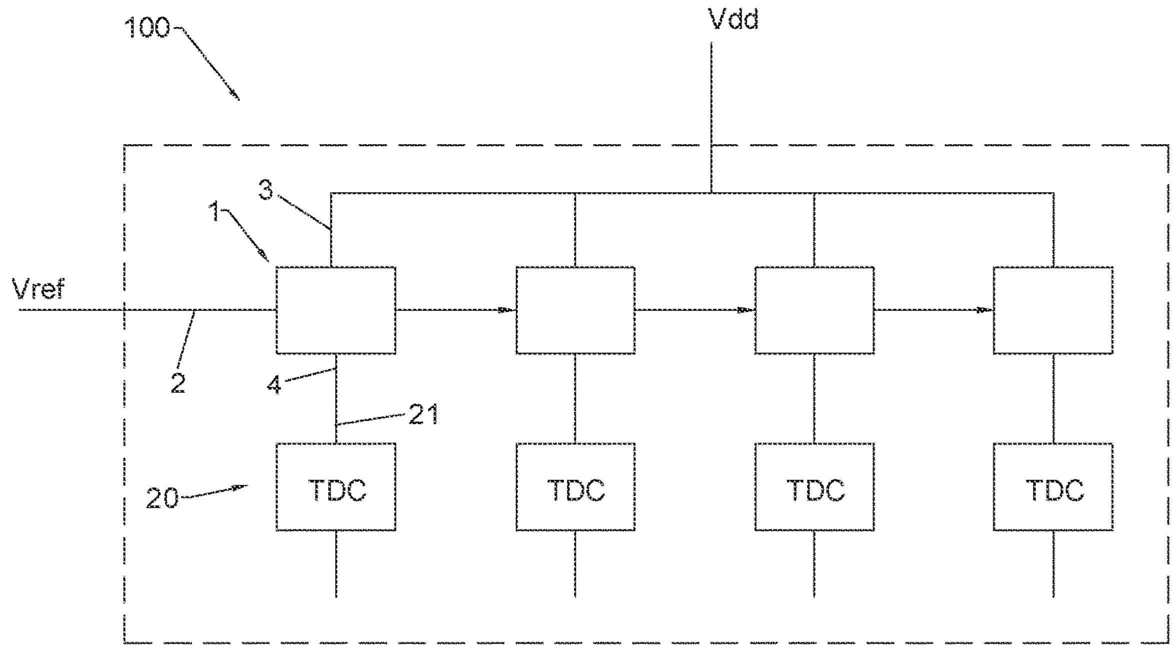
FIG. 5 represents the basic diagram of the circuit architecture of the invention comprising a plurality of power supply circuit modules of the invention.
Figure 6:
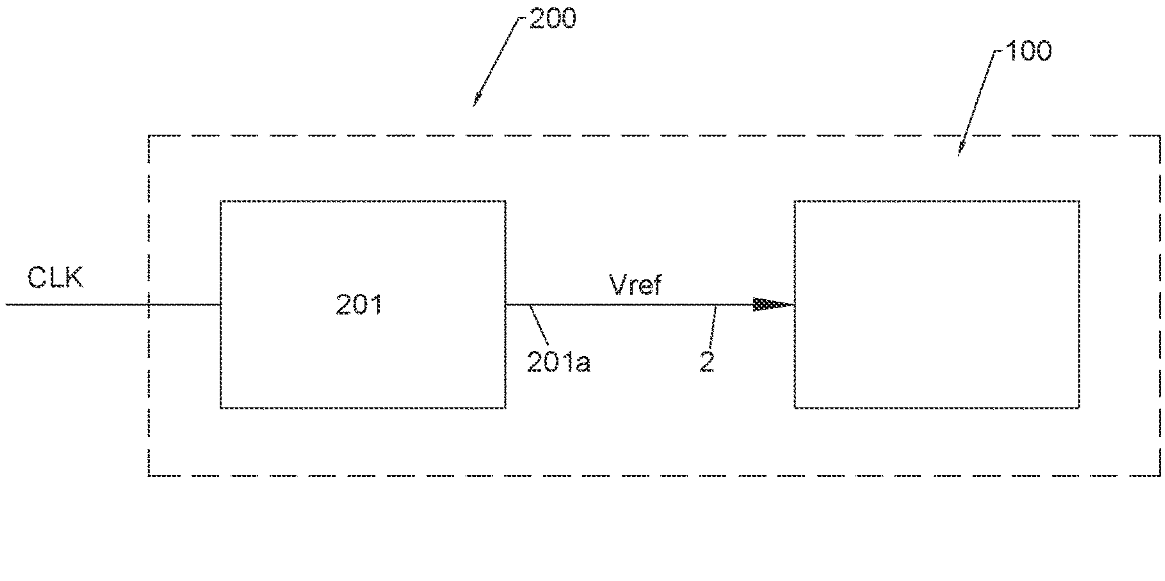
FIG. 6 represents the basic diagram of a first type of circuit regulator of the invention comprising the circuit architecture of FIG. 5.
Figure 7:
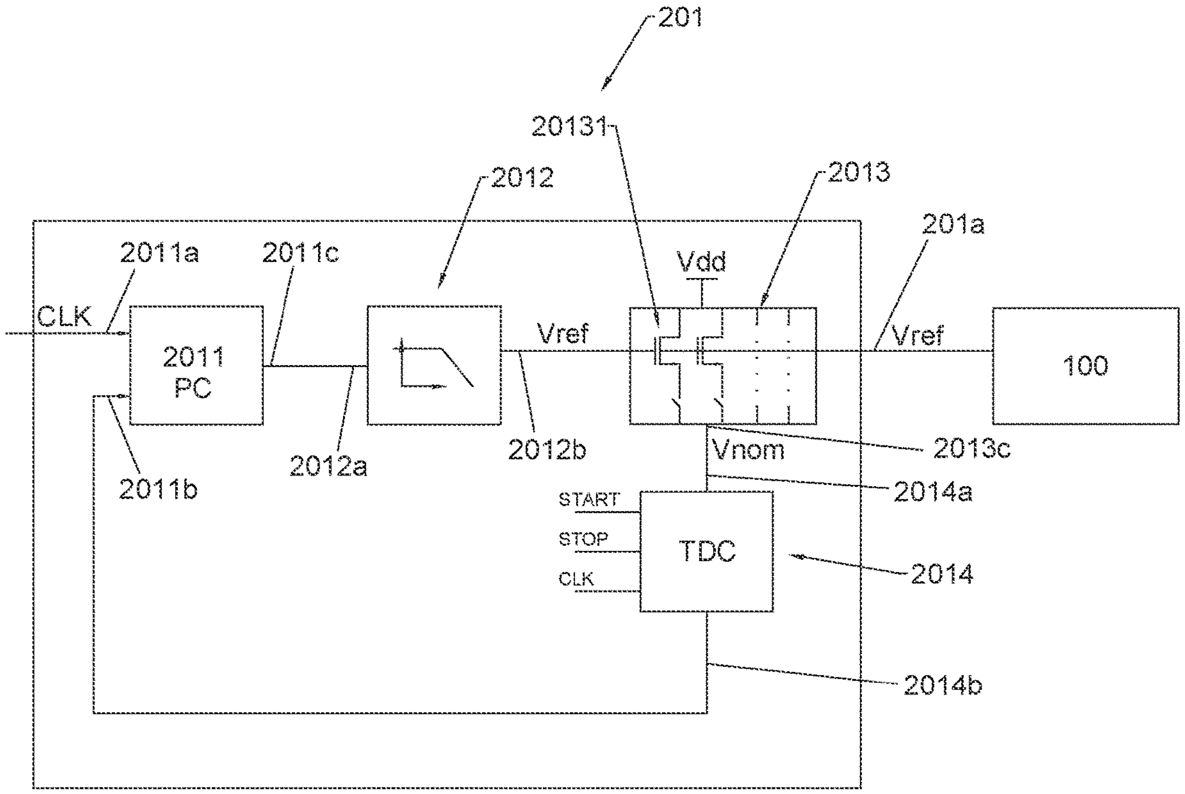
Figure 8:
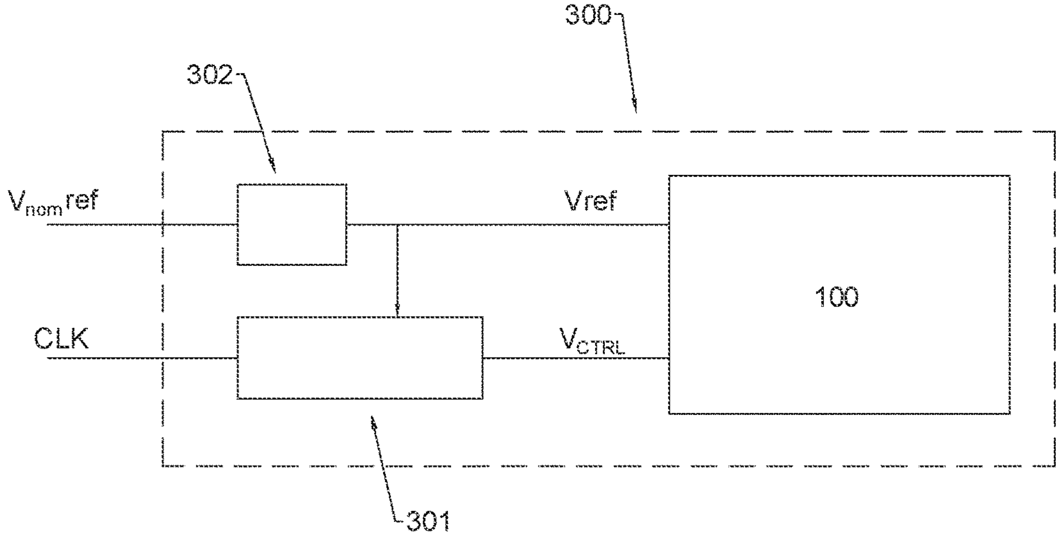
Figure 9:
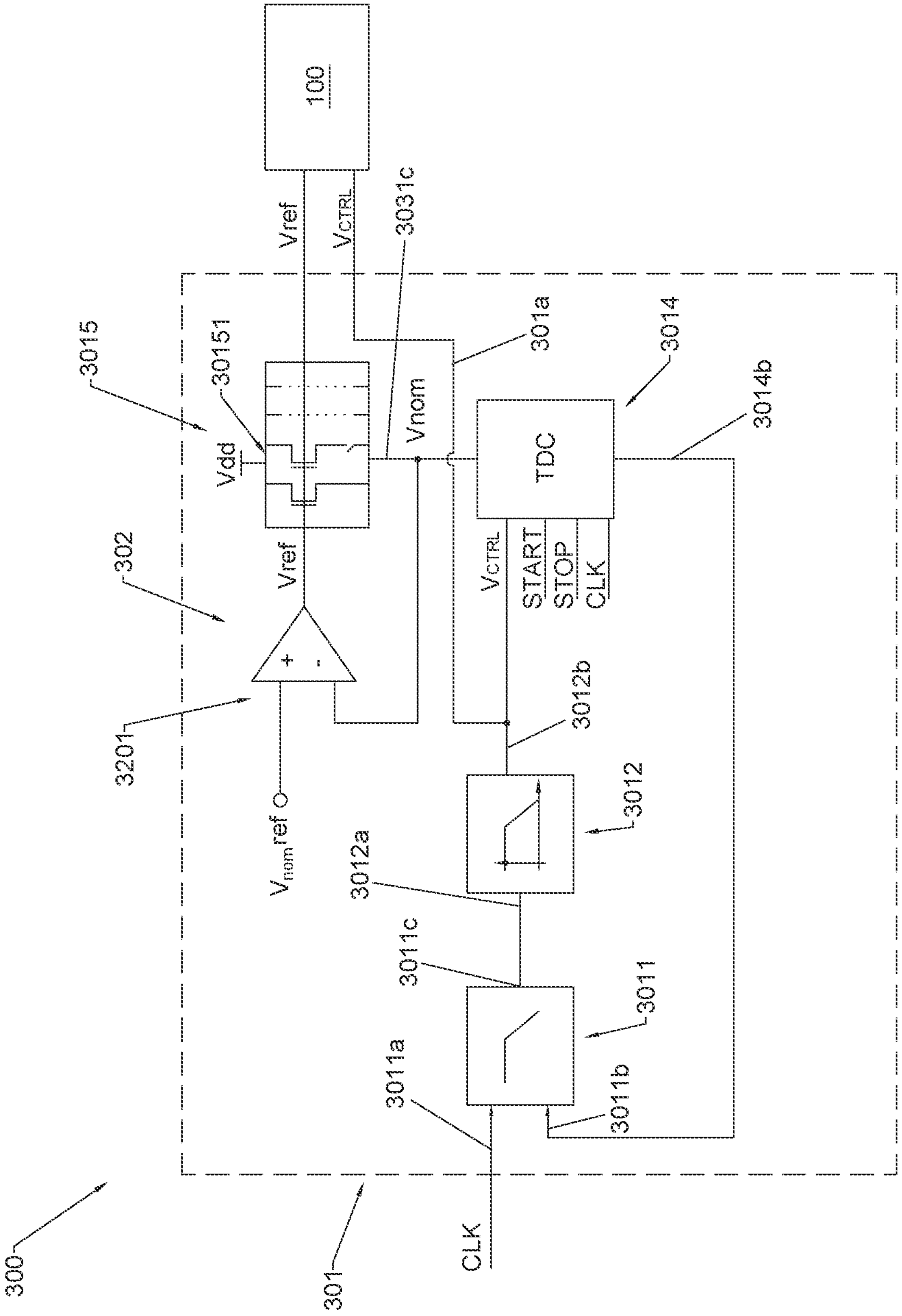

FIG. 7 schematically represents the structure of the PLL belonging to the circuit regulator of FIG. 6;

FIG. 8 represents the basic diagram of a second type of circuit regulator of the invention comprising the circuit architecture of FIG. 5;

FIG. 9 schematically represents the structure of the PLL and the operational amplifier belonging to the circuit regulator of FIG. 8.

The power supply circuit module of the invention, configured to deliver a power supply voltage to a TDC (Time to Digital Converter) device, is represented according to a preferred embodiment in figures from 1 to 3, where it is indicated as a whole with 1.

Said power supply circuit module 1 comprises a first input 2 for receiving a control signal Vref. Said control signal Vref, as will be described in detail below, is generally delivered to the power supply circuit module 1 of the invention by a circuit known in electronics as PLL or also by any other electronic circuit capable of delivering a control signal Vref.

As regards the aforesaid control signal Vref, as will be clarified below, it is a voltage whose value can be dependent, according to a monotonic function, on a pre-established periodic reference signal CLK used as a clock in the electronic system to which the power supply circuit module 1 of the invention and the related TDC 20 belong, like in the circuit regulator of FIG. 7, or the value of said control signal Vref can be stabilised by means of an operational amplifier in feedback to which a nominal reference voltage $V_{nom}$ref is placed at the input, like in the circuit regulator of FIG. 9.

The power supply circuit module 1 of the invention furthermore comprises a second input 3 for receiving a power supply voltage Vdd and also comprises an output 4 configured to be connected to the power supply input 21 of the aforesaid TDC 20.

According to the preferred embodiment of the invention, the power supply voltage Vdd is selected in the range between 0.9 V and 5.0 V, preferably it is selected around 3.3 V.

However, it is not excluded that said power supply voltage Vdd is set at values other than those indicated above, provided that they are suitable for supplying the power supply circuit module 1 appropriately.

Said power supply circuit module 1 of the invention is configured to deliver to the TDC 20 a nominal power supply voltage value Vnom substantially proportional to the control signal Vref.

As previously mentioned, the value of the nominal power supply voltage Vnom delivered at the input to the TDCs determines, exclusively or in combination with a further control signal, defined below Vctrl, the operating speed of the TDCs themselves. Therefore, if a nominal power supply voltage Vnom dependent on a predefined periodic reference signal CLK is delivered to a TDC device, this theoretically entails the alignment of the operating speed of the same TDC with the frequency of the aforesaid periodic reference signal CLK.

If, on the other hand, the nominal power supply voltage Vnom is stabilised according to a nominal reference voltage $V_{nom}$ref, this entails an operating speed of the same TDC 20 equal to the average speed defined by the referencing of the same TDC 20 by means of the aforesaid control voltage Vctrl, distinct from the power supply voltage Vnom.

According to the preferred embodiment of the invention, the nominal power supply voltage Vnom is set at a value selected in the range between 0.9 V and 5.5 V, preferably it is selected around 1.8 V.

However, it is not excluded that said nominal power supply voltage Vnom is set to values other than those indicated above, provided that they are suitable for supplying the TDC device 20 appropriately.

Figure 1:
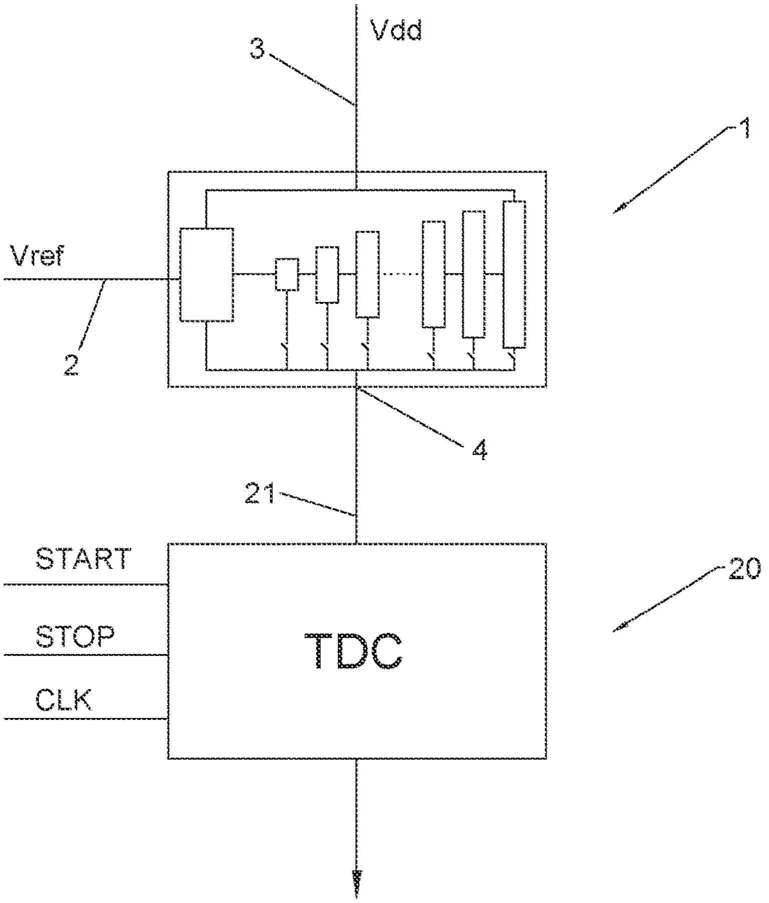
Figure 2:
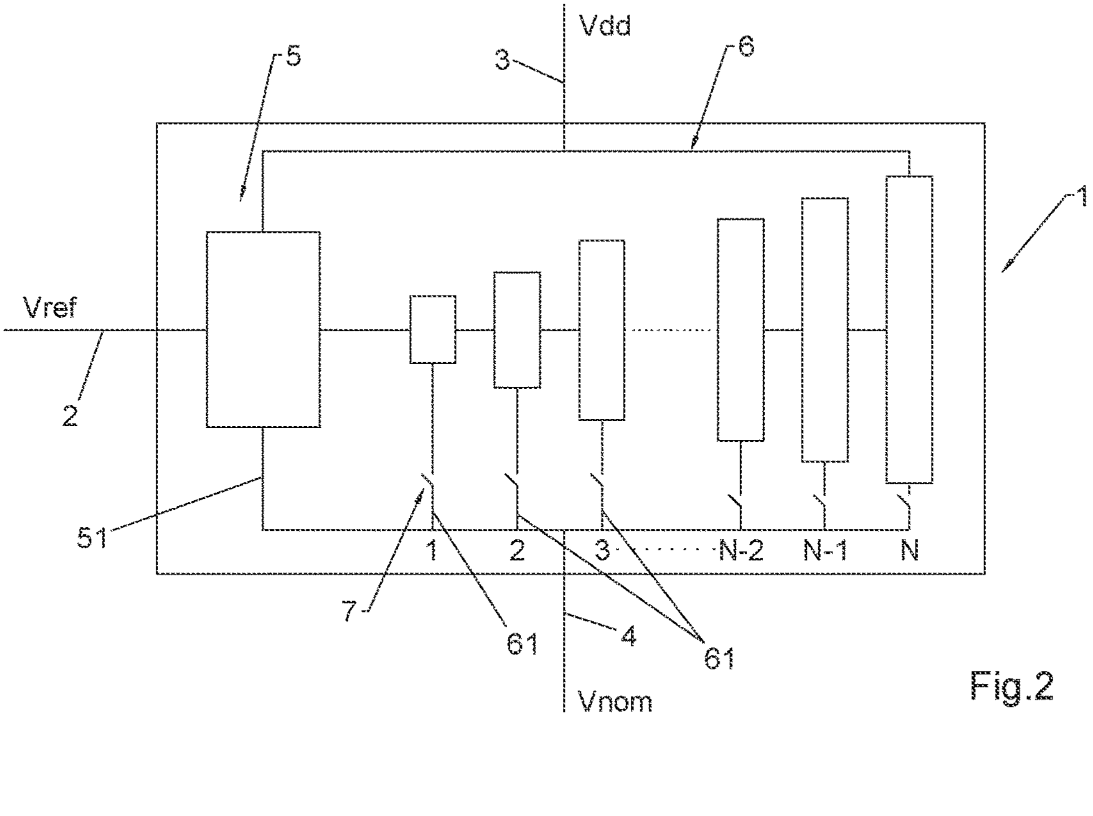
FIG. 2 represents the basic diagram of the power supply circuit module of the invention.

According to the invention, as schematised in FIG. 2, the power supply circuit module 1 comprises an active main power supply device 5 having its own output 51 connected to the aforesaid output 4.

Said active main power supply device 5 is configured to receive the control signal Vref at the input and to contribute on the value of the power supply voltage resulting at the output 4 by a voltage value lower than a first predefined percentage PP1 with respect to the nominal power supply voltage Vnom, under the conditions of nominal current absorption.

As regards the value of the aforesaid first predefined percentage PP1, it is a fixed value established a priori and is preferably selected within the range between 5% and 20% of the nominal power supply voltage Vnom, even more preferably said first predefined percentage PP1 is selected substantially equal to 10%.

The power supply circuit module 1 of the invention further comprises a number N of active secondary power supply devices 6, each of which is configured to receive at the input the same control signal Vref delivered at the input to the active main power supply device 5.

Each of said N active secondary power supply devices 6 has its own output 61 connected in common with the outputs 61 of the remaining N-1 active secondary power supply devices 6 and with the output 51 of the active main power supply device 5 by means of a switch device 7, as schematised in FIG. 2. Some implementation variants of the aforesaid switch devices 7 will be specified below. However, it is important to clarify that the aforesaid expression "by means of a switch device 7" generally refers to any configuration of the various electronic components mentioned above that allows any n-th active secondary power supply device 6 to be either connected or disconnected, being $n \in [1,N]$, either with the remaining or from the remaining N-1 active secondary power supply devices 6 and with the active main power supply device 5, and therefore allowing said n-th active secondary power supply device 6 to be either connected or disconnected with the output/from the output 4 of the power supply circuit module 1.

This feature, in fact, allows, as will be clarified below, to obtain at the output from the power supply circuit module 1 of the invention a voltage value resulting from the contribution of the active main power supply device 5 and from each single n-th active secondary power supply device 6 whose switch device 7 allows the connection thereof with the aforesaid output 4 of the power supply circuit module 1.

Furthermore, according to the invention, each n-th active secondary power supply device 6 is configured to contribute to provide at the output a current value different from the remaining N-1 active secondary power supply devices 6.

In particular, preferably but not necessarily, considering the active secondary power supply devices 6 in sequence from 1 to N, each n-th active secondary power supply device 6 is configured to contribute on the value of the resulting power supply voltage by a percentage substantially the double with respect to the percentage of contribution given by the n-th−1 active secondary power supply device 6 and substantially halved with respect to the percentage of contribution given by the n-th+1 active secondary power supply device 6.

In other words, the N active secondary power supply devices 6, in sequence from 1 to N, are configured so as to contribute to the power supply voltage resulting at the output 4 according to increasing percentages of contribution according to a power of 2.

Furthermore, according to the invention, the active secondary power supply devices 6 are jointly configured so that their overall contribution to the value of the power supply voltage at the output 4 is equal to a second predefined percentage PP2 with respect to the value of the nominal power supply voltage Vnom, under the conditions of nominal current absorption.

Even more specifically, according to the invention, this second predefined percentage PP2 is variable between a value around zero and a value substantially equal to twice the value of the first percentage PP1 selected during the design step of the power supply circuit module 1 of the invention.

This variation of the second predefined percentage PP2, as will be clarified below, is caused by the connection to the output 4 or by the disconnection from the same output 4 (therefore by the activation or deactivation) of each of the active secondary power supply devices 6.

According to the preferred embodiment of the invention, the power supply circuit module 1 of the invention is configured to vary said second predefined percentage PP2 from 0% to 10%, if the first pre-established percentage PP1 has been selected equal to the minimum value indicated above, i.e. 5%. At the opposite end, according to a variant embodiment of the invention, the power supply circuit module 1 is configured to vary said second predefined percentage PP2 from 0% to 40%, if the first pre-established percentage PP1 has been selected equal to the maximum value indicated above, i.e. 20%.

Clearly, the variation of said second predefined percentage PP2 can fall within all the intermediate ranges among those indicated above, if the first pre-established percentage PP1 has been selected equal to any intermediate value between 5% and 20%, provided that it is preferably but not necessarily observed the relationship indicated above between the two predefined percentages PP1 and PP2.

Therefore, the power supply voltage value delivered to the output 4 of the power supply circuit module 1 can vary between Vnom (1-PP1) and Vnom (1-PP1+PP2) i.e. within the range Vnom (1±PP1) if PP2=2*PP1.

Advantageously, said configuration, for the reasons explained below, allows the output voltage of the power supply circuit module 1 to be varied by a certain percentage within the nominal power supply voltage Vnom of the specific TDC 20 to which the power supply module itself 1 is connected.

As will be clarified during the description of the calibration method of the invention, contrary to the first percentage PP1, which is set during the design step of the power supply circuit module 1, the value of the aforesaid percentage PP2 is identified for each specific TDC 20 by means of precisely the implementation of said method. Said calibration of each TDC 20 is preferably performed simultaneously with the calibration of the remaining TDCs 20.

A further aspect relating to the preferred embodiment of the power supply circuit module 1 of the invention relates to the fact that both the active main power supply device 5 and the N active secondary power supply devices 6 are transistor devices made in MOS technology.

Figure 3:
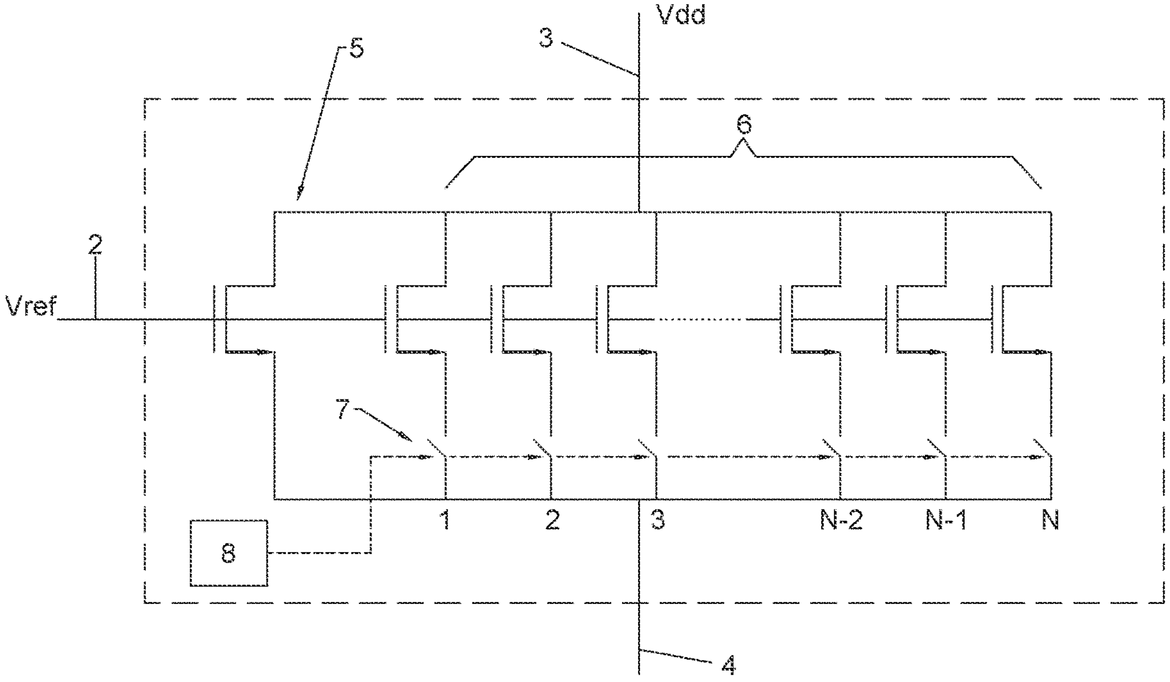
FIG. 3 represents the implementation, according to a preferred embodiment, of the power supply circuit module of the invention.

Even more specifically, as can be seen in the circuit diagram of FIG. 3, the active main power supply device 5 and the N active secondary power supply devices 6 are transistor devices made in NMOS technology. In this case, the reference signal Vref is delivered to the gate terminal of each transistor and the power supply voltage Vdd is imposed on the drain terminal of each transistor.

It is not excluded, however, that according to variant embodiments of the invention said active main power supply device 5 and the N active secondary power supply devices 6 can be made as transistors in PMOS technology, or they can be defined by means of different types of electronic components, provided that they are capable of providing a power supply voltage at the output 4 of the power supply circuit module 1 whose value is established within the nominal power supply voltage Vnom of the TDC 20 to which the power supply circuit module 1 is connected.

Moreover, as regards the specific implementation of the active main power supply device 5 and of the N active secondary power supply devices 6 as MOS transistors, the percentage contribution of each of them on the voltage value resulting at the output 4 is determined during the design step by selecting, in an appropriate way, the specific dimensional ratio W/L of each of them.

In particular, the value of the dimensional ratio W/L of the MOS transistor defining the active main power supply device 5 is selected, during the design step, so that the same active main power supply device 5 is able to contribute for a voltage value lower than the nominal power supply voltage Vnom of the aforesaid first percentage PP1. In the same way the values of the dimensional ratios W/L of the NMOS transistors representing the N active secondary power supply devices 6 are selected during the design step so that, considering said active secondary power supply devices 6 in sequence from 1 to N, each n-th active secondary power supply device 6 is configured to contribute as a percentage on the resulting output voltage substantially for a percentage that is the double with respect to the percentage of contribution given by the n-th−1 active secondary power supply device 6 and substantially with a percentage of contribution halved with respect to the percentage of contribution given by the n-th+1 active secondary power supply device 6 and so that the percentage of contribution on the power supply voltage resulting at the output 4 of the power supply circuit module 1 given by all said N active secondary power supply devices 6 is equal to the maximum value of the second predefined percentage PP2, when all said N active secondary power supply devices 6 are connected to the output 4 of the same power supply circuit module 1.

Therefore, theoretically, the power supply voltage at the output 4 is the nominal voltage Vnom when the same output 4 is clearly connected to the active main power supply device 5 and, among all the N active secondary power supply devices 6, only and exclusively to the n-th active secondary power supply device 6 configured to contribute with a percentage more than the remaining N-1 active secondary power supply devices 6.

Figure 4:
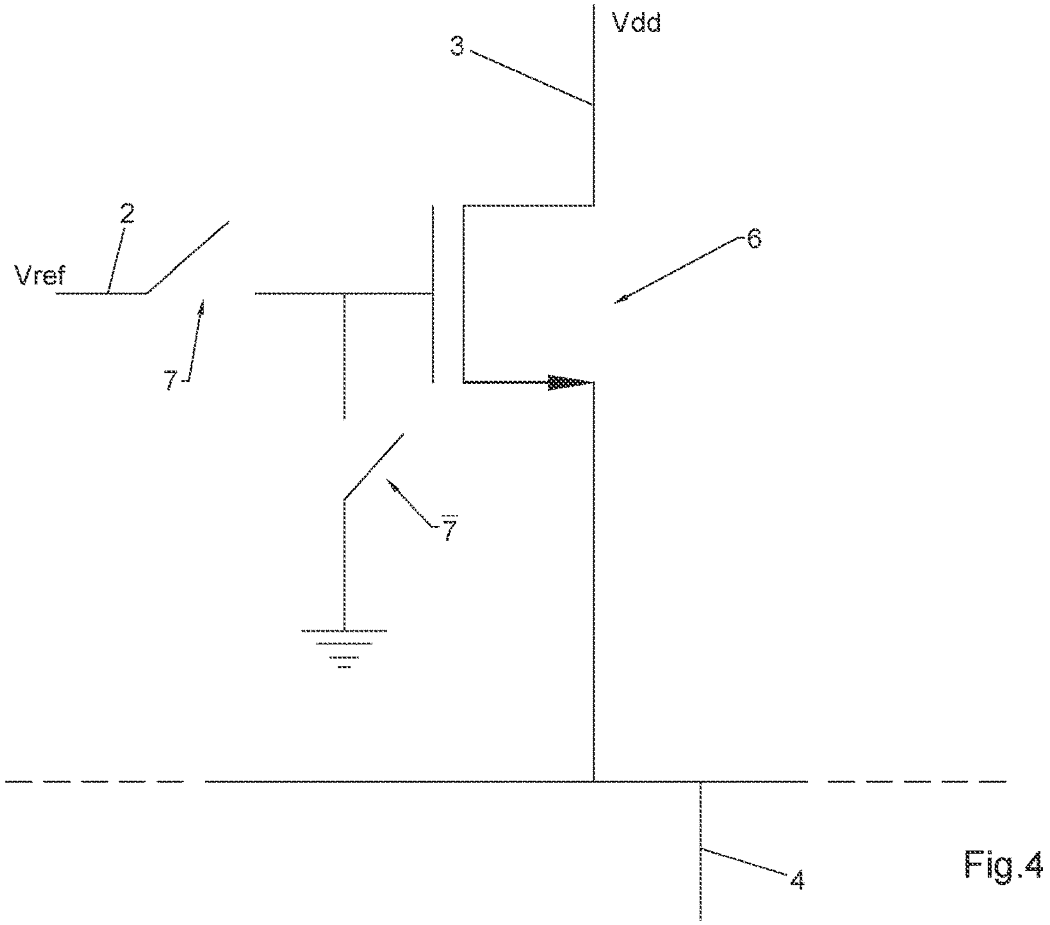
FIG. 4 represents the implementation, according to the preferred embodiment, of the switch device associated with each of the active secondary power supply devices belonging to the power supply circuit module of the invention.

As regards the switch devices 7, preferably but not necessarily they are implemented according to the circuit diagram of FIG. 4.

This implementation advantageously allows to avoid current peaks during the transients of the same switch devices 7. It is not excluded, however, that according to a different embodiment of the invention the aforesaid switch means 7 are defined between the source terminal of each NMOS transistor defining each n-th active secondary power supply device 6 and the output 4 of the power supply circuit module, as shown in FIG. 2.

According to the preferred embodiment of the invention, the power supply circuit module 1 of the invention further comprises a control unit 8 configured to determine the activation and deactivation of the N active secondary power supply devices 6 during the operation of the same power supply module of a TDC device 20.

More specifically, the control unit 8 is configured to determine the value of the second predefined percentage PP2 during the calibration step and to set the power supply circuit module 1 according to said calibration during the actual conversion, in general, of a time, and in particular of the time of flight, to a digital value by the TDC 20.

According to the invention, the control unit 8 is configured to implement said determination of the second percentage PP2 by carrying out a successive approximation calibration method based, for each iteration, on the comparison between the period of the periodic reference signal CLK and the full scale condition of the TDC 20. The specific operating steps of the aforesaid method, also part of the present invention, will be defined in detail below.

It is not excluded, however, that said control unit 8 is not part of the single power supply circuit module 1 of the invention, but that it is an external control unit common to all the power supply circuit modules 1 belonging to an electronic device, in particular to a sensor, comprising a plurality of TDCs 20.

In this regard, as mentioned above, the circuit architecture 100 is also part of the invention, of which an exemplary embodiment is represented in FIG. 5.

Said circuit architecture 100, according to the invention, comprises in particular a plurality of TDC devices 20 and a plurality of power supply circuit modules 1 of the invention. In detail, each of the TDC devices 20 is connected with its own input port 21 to one of the power supply circuit modules 1. Furthermore, according to the invention, all the aforesaid power supply circuit modules 1 are configured to receive the same control signal Vref at the input.

According to the preferred embodiment of the invention, preferably but not necessarily, the circuit architecture 100 belongs to an optical sensor for detecting the time of flight (ToF) of the single photons that hit the sensitive surface of the same sensor.

Even more specifically, said optical sensor is implemented as a SPAD/SiPM optical sensor comprising a plurality of pixels, where each of the aforesaid pixels or each group of the aforesaid pixels is connected to a TDC 20 coupled to a power supply circuit module 1 of the aforesaid circuit architecture 100.

Furthermore, a first type of circuit regulator 200, represented in FIG. 6, comprising a PLL (Phase locked loop) device 201 and the circuit architecture 100 of the invention is also part of the invention. In particular, the PLL device 201 provides that its output 201*a*, in which the aforesaid control signal Vref is available, is connected to the input 2 of each of the power supply circuit modules 1 belonging to the circuit architecture 100.

Still more specifically, preferably but not necessarily, the PLL device 201, as represented in FIG. 7, comprises, in a feedback loop configuration, a phase comparison circuit element 2011, also known as Phase Comparator (PC) or as Phase Frequency Comparator (PFC), to which, at its own first input 2011*a*, the aforesaid periodic reference signal CLK is delivered. Said PLL device 201 further comprises a low pass filter 2012 connected at the input 2012*a* to the output 2011*c* of the aforesaid comparator 2011 and to whose output 2012*b* the aforesaid control signal Vref is in turn available. Furthermore, according to the invention, the PLL device 201 comprises a power supply circuit module 2013, preferably provided with an active power supply device 20131, even more preferably an NMOS transistor, which receives the aforesaid control signal Vref at the input and which is connected at the output 2013*c* to a TDC 2014 configured in "free-running" mode.

Preferably, the power supply circuit module 2013 is a replica of the power supply circuit module 1 of the invention where only and exclusively the active main power supply device 5 and the n-th active secondary power supply device 6 configured to contribute with a percentage more than the remaining N-1 active secondary power supply devices 6 are connected to the output 4. Clearly, the control signal Vref delivered at the input to the power supply circuit module 2013 is the same one delivered at the input to the power supply circuit modules 1 of the circuit architecture 100.

The term "free-running" means an operation mode of the TDC 2014 so that the start signal that is dependent on the aforesaid periodic reference signal CLK is delivered and so that the stop signal is never delivered.

This allows the TDC 2014 to continue cycling from its minimum value to its full scale.

The output 2014*b* of the TDC 2014 in free-running is placed at the input to the second input 2011*b* of the phase comparator 2011 as a second comparison value. In this way, therefore, the phase comparator is able to verify whether the full scale digital value of the TDC 2014 in free-running is in phase and at the same frequency as the periodic reference signal CLK. If there is a discrepancy between the two signals, the phase comparator 2011 shows at its output 2011*c* a signal which represents the error between them. As previously seen, from said error signal, the aforesaid low pass filter 2012 generates the control signal Vref placed at the input to the power supply circuit module 2013 and to the various power supply circuit modules 1 belonging to the circuit architecture 100 of the invention.

Said configuration of the circuit regulator 200, in addition to allowing to obtain all the advantages already described above for the power supply circuit module 1 of the invention and those that will be indicated below for the calibration method of the invention, also allows to keep the calibration of the single power supply circuit module 1 unaltered even when the temperature at which the same controller operates varies.

In fact, since all the power supply circuit modules 1 of the circuit architecture 100 and the power supply circuit module 2013 of the PLL 201 comprise only and exclusively a transistor device of the same type, and furthermore also the TDCs 20 associated with the various power supply circuit modules 1 and the TDC 2014 of the PLL 201 are made with the same architecture, all these devices have the same physical characteristics and the same electrical behaviour and therefore the variation in temperature leads to an equal variation in their operating conditions. Therefore, although said variation in temperature leads to the adaptation of the control signal Vref due to the power supply circuit module 2013 connected to the TDC 2014 in free-running, said adaptation is exactly the one required by the power supply circuit modules 1 connected to the other TDCs 20 of the circuit architecture 100, following the aforesaid temperature variation.

Therefore, the result of the calibration of the single power supply circuit modules 1 remains advantageously valid and therefore unchanged even when the operating temperature of the relative TDC 20 varies.

A second type of circuit regulator 300, represented in FIG. 8, comprising a PLL (Phase locked loop) device 301, a stabilisation circuit 302, preferably a feedback operational amplifier 3021 and the circuit architecture 100 of the invention is also part of the invention.

Said second type of regulator 300 is adapted to carry out the referencing and the calibration of TDCs 20 belonging to the circuit architecture 100 configured to receive at the input both a power supply voltage Vnom and a control voltage Vctrl as described above.

As regards the PLL device 301, as can be seen in FIG. 9, it provides that its output 301*a*, in which a control signal Vctrl is available, is connected to the control input of each of the TDCs 20 belonging to the circuit architecture 100.

Even more specifically, preferably but not necessarily, the PLL device 301 comprises, in a feedback loop configuration, a phase comparison circuit element 3011, also known as Phase Comparator (PC) or as Phase Frequency Comparator (PFC), to which, at a first input thereof 3011*a*, the aforesaid periodic reference signal CLK is delivered. Said PLL device 301 further comprises a low pass filter 3012 connected at the input 3012*a* to the output 3011*c* of the aforesaid comparator 3011 and at whose output 3012*b* the aforesaid control signal Vctrl is in turn available.

Furthermore, according to the invention, the PLL device 301 comprises a TDC 3014 configured in "free-running" mode and at whose control input said control signal Vctrl is placed.

The term "free-running" means an operation mode of the TDC 3014 so that the start signal that is dependent on the aforesaid periodic reference signal CLK is delivered and so that the stop signal is never delivered.

This allows the TDC 3014 to continue cycling from its minimum value to its full scale.

The output 3014*b* of the TDC 3014 in free-running is placed at the input to the second input 3011*b* of the phase comparator 3011 as a second comparison value. In this way, therefore, the phase comparator is able to verify whether the full scale digital value of the TDC 3014 in free-running is in phase and at the same frequency as the periodic reference signal CLK. If there is a discrepancy between the two signals, the phase comparator 3011 shows at its output 3011*c* a signal which represents the error between them. As previously seen, from said error signal, the control signal Vctrl placed at the input to the circuit module TDC 3014, as well as to the various TDCs 20 belonging to the circuit architecture 100 of the invention, is generated by means of the aforesaid low pass filter 3012.

The PLL 301 further comprises a power supply circuit module 3015, preferably provided with an active power supply device 30151, even more preferably an NMOS transistor, which receives the aforesaid control signal Vref at the input and which is connected at the output 3031*c* to the power supply input of the aforesaid TDC 3014 configured in "free-running" mode, so as to deliver to the latter the nominal power supply voltage Vnom.

Preferably, the power supply circuit module 3015 is a replica of the power supply circuit module 1 of the invention where only and exclusively the active main power supply device 5 and the n-th active secondary power supply device 6 configured to contribute with a percentage more than the remaining N-1 active secondary power supply devices 6 are connected to the output 4. Clearly, the control signal Vref delivered to the input of the power supply circuit module 3015 is placed at the input of also the power supply circuit modules 1 of the circuit architecture 100.

The control signal Vref is delivered to the power supply circuit module 3015 by means of the aforesaid stabilisation circuit 302, which preferably is an operational amplifier 3021 in feedback. Even more specifically, as represented in FIG. 9, a nominal reference voltage $V_{nom}$ref is placed at the input to the non-inverting terminal of the operational amplifier 3021 and the power supply voltage Vnom is placed at the input to its inverting terminal at the output from the aforesaid power supply circuit module 3015.

This stabilisation circuit 302 in fact allows to stabilise the control signal Vref on the basis of the nominal reference voltage $V_{nom}$ref.

As mentioned above, the successive approximation calibration method of a power supply circuit module 1 of the invention is also part of the invention.

The method of the invention, in particular, provides for a plurality of steps to be repeated cyclically, for a number of cycles at least equal to the number N of active secondary power supply devices 6, as will be clarified below.

The starting condition for carrying out the calibration method of the invention provides for setting, by means of the control unit 8, the switch devices 7 of the N active secondary power supply devices 6, so as to activate the active secondary power supply device 6 configured to contribute with a higher percentage among all N-1 active secondary power supply devices 6, and also provides for deactivating the remaining N-1 active secondary power supply devices 6.

Said starting configuration allows to deliver to the TDC 20 a power supply voltage value given by the contribution of the active main power supply device 5 and the aforesaid n-th active secondary power supply device 6.

In other words, the voltage resulting at the output 4 of the power supply circuit modules 1 and delivered to the TDC 20 is equal to the nominal power supply voltage Vnom less than the first percentage PP1 and having instead a contribution equal to the second percentage PP2 with the same nominal voltage Vnom, under the conditions of nominal current absorption, where the second percentage PP2 is substantially defined half its variation interval, therefore substantially equal to the first predefined percentage PP1.

More simply, we start from a condition whereby the resulting voltage is theoretically equal to the aforesaid nominal power supply voltage Vnom, under the conditions of nominal current absorption.

Once said initialisation value of the voltage of the power supply circuit module 1 of the invention has been established, the same method envisages placing said voltage at the input to the TDC 20, also delivering to the TDC 20 itself a start signal and a stop signal whose time distance is equal to a single period of the periodic reference signal CLK.

In practice, during calibration, the start and stop signals have the purpose of simulating an event with a duration equal to the period of the same periodic reference signal CLK, with the expectation of obtaining at the output from the TDC 20 a digital value equal to the full scale of the latter.

Once said output signal of the TDC 20 has been acquired, the calibration method provides for verifying the real value of the aforesaid digital signal, in particular whether the digital value obtained by the TDC 20 has exceeded the full scale or not.

In the affirmative case, this means that the power supply voltage delivered to the TDC 20 is not actually adequate to operate the same TDC 20 at a speed aligned with the period of the periodic reference signal CLK. In other words, the TDC 20 is slower than the aforesaid periodic reference signal CLK. In this case, therefore, during the subsequent iteration, the method provides for increasing the value of the power supply voltage delivered to the TDC 20, so as to thus increase the speed of the latter. To implement said increase, the method also envisages activating the active secondary power supply device 6 configured to contribute to the output power supply voltage by a percentage lower than and closer to the percentage of contribution given by the last one of the active secondary power supply devices 6 activated. More preferably, the percentage of contribution substantially equal to half the percentage value of the last of the active secondary power supply devices 6 activated is added to the contribution to the power supply voltage delivered to the TDC 20 during the previous interaction.

In the negative case, that is, when the comparison shows that the digital value generated by the TDC 20 does not exceed the full scale, it means that the TDC 20 itself is faster than the periodic reference signal CLK. Therefore, in order to slow down the TDC 20, the method of the invention provides for deactivating the last one of the active secondary power supply devices 6 previously activated and on the contrary for activating the active secondary power supply device 6 configured to contribute by a percentage on the voltage resulting at the output lower than and closer to the value of the percentage of contribution given by the last active secondary power supply device 6.

More preferably, the power supply voltage previously delivered to the TDC 20 is decreased by a percentage equal to half the percentage of contribution given by the last one of the active secondary power supply devices 6 that was active during the previous iteration.

Said steps, apart from the initialisation step described above, are repeated according to the method of the invention until all the N active secondary power supply devices 6 are considered.

In practice, the repetition of said steps takes place until the n-th active secondary power supply device 6 configured to contribute to the resulting power supply voltage by a lower percentage among all the N active secondary power supply devices 6 is considered.

The repetition of said steps allows to determine, by means of successive approximations, the real specific power supply voltage value for each TDC 20 so as to obtain an alignment as much precise as possible between the operating speed of the latter and the period of the periodic reference signal CLK.

Once all said N active secondary power supply devices 6 have been considered, the method of the invention provides for storing the activation and deactivation sequence identified with the calibration method, so as to set the power supply circuit module 1 relating to the specific TDC 20 with the aforesaid sequence when using the latter for measuring the time of flight of any event.

Therefore, on the basis of what has been said, the power supply circuit module and the calibration method of the same achieve all the predetermined purposes.

In particular, the object of realising a power supply circuit module for TDC and of proposing a method for calibrating said module which allow to define as precisely as possible the power supply voltage for the single TDC independently from the other TDCs is achieved.

Another object achieved by the invention is the realisation of a power supply circuit module and the implementation of the calibration method of said module which allow to dynamically adapt the value of the nominal power supply voltage of each TDC when the intrinsic and extrinsic operating conditions of the latter varies.

The invention claimed is:

1. A power supply circuit module for a TDC (Time to Digital Converter) comprising:

a first input for receiving a control signal (Vref);

a second input for receiving a power supply voltage (Vdd);

an output configured to be connected to the power supply input of said TDC, said power supply circuit module being configured to deliver to said TDC a nominal power supply voltage value (Vnom) substantially dependent on said control signal (Vref);

wherein said power supply circuit module comprises:

an active main power supply device having its own output connected to said output, said active main power supply device being configured to receive said control signal (Vref) at the input and to contribute on the value of the power supply voltage resulting at said output by a voltage value lower than a first predefined percentage (PP1) with respect to said nominal power supply voltage (Vnom), under the conditions of nominal current absorption;

a number N of active secondary power supply devices configured to receive said control signal (Vref) at the input, each of said active secondary power supply devices having its own output connected in common with the outputs of the remaining N-1 active secondary power supply devices and with said output of said active main power supply device by a switch device, each of said active secondary power supply devices being configured to contribute on the value of the power supply voltage resulting at said output by a percentage different from the remaining active secondary power supply devices and all said active secondary power supply devices being configured as a whole to contribute on the value of said power supply voltage resulting at said output by a second predefined percentage (PP2) of the value of said nominal power supply voltage (Vnom), under the conditions of nominal current absorption, said second predefined percentage (PP2) being variable between zero and substantially twice said first pre-established percentage (PP1), said second predefined percentage (PP2) being determined by activating and/or deactivating each of said active secondary power supply devices by the relative switch device.

2. The power supply circuit module according to claim 1, wherein, considering said active secondary power supply devices in sequence from 1 to N, each n-th active secondary power supply device is configured to contribute on said power supply voltage resulting at said output by a percentage substantially the double with respect to the percentage of contribution given by the n-th+1 of said active secondary power supply devices and substantially halved with respect to the percentage of contribution given by the n-th+1 of said active secondary power supply devices.

3. The power supply circuit module according to claim 1, wherein said active main power supply device and said N active secondary power supply devices are transistor devices in MOS technology.

4. The power supply circuit module according to claim 3, wherein said first active main power supply device and said N active secondary power supply devices are transistor devices in NMOS technology, said control signal (Vref) being delivered to the gate terminal and said power supply voltage being imposed on the drain terminal of each of said active main power supply device and of said N active secondary power supply devices.

5. The power supply circuit module according to claim 4, wherein:

the value of the dimensional ratio W/L of the NMOS transistor defining said active main power supply device is selected during the design step so that said active main power supply device is configured to contribute on the power supply voltage resulting at said output by a voltage value lower than a first predefined percentage (PP1) with respect to said nominal power supply voltage (Vnom), under the conditions of nominal current absorption;

the values of the dimensional ratios W/L of the NMOS transistors representing said N active secondary power supply devices are selected during the design step so that, considering said active secondary power supply devices in sequence from 1 to N, each n-th active secondary power supply device is configured to contribute on the value of the power supply voltage resulting at said output by a percentage substantially the double with respect to the percentage of contribution given by the n-th −1 of said active secondary power supply devices and substantially halved with respect to the percentage of contribution given by the n-th+1 of said active secondary power supply devices and so that all said active secondary power supply devices are configured as a whole to contribute on the value of said power supply voltage resulting at said output by a second predefined percentage (PP2) of the value of said nominal power supply voltage (Vnom), under the conditions of nominal current absorption.

6. The power supply circuit module according to claim 1, that comprises a control unit configured to determine the activation and deactivation of said N active secondary power supply devices during the operation of said power supply circuit module and therefore to determine the value of said second predefined percentage (PP2) of the nominal power supply voltage (Vnom) by carrying out a successive approximation calibration method based for each cycle on the comparison between the period of a periodic reference signal (CLK) on which said control signal (Vref) depends and the full scale state of said TDC.

7. A circuit architecture comprising a plurality of TDC (Time to Digital Converter) devices and a plurality of power supply circuit modules, each of the power supply circuit modules comprising:

a first input for receiving a control signal (Vref);

a second input for receiving a power supply voltage (Vdd);

an output configured to be connected to the power supply input of said TDC, said power supply circuit module being configured to deliver to said TDC a nominal power supply voltage value (Vnom) substantially dependent on said control signal (Vref);

an active main power supply device having its own output connected to said output, said active main power supply device being configured to receive said control signal (Vref) at the input and to contribute on the value of the power supply voltage resulting at said output by a voltage value lower than a first predefined percentage (PP1) with respect to said nominal power supply voltage (Vnom), under the conditions of nominal current absorption;

a number N of active secondary power supply devices configured to receive said control signal (Vref) at the input, each of said active secondary power supply devices having its own output connected in common with the outputs of the remaining N-1 active secondary power supply devices and with said output of said active main power supply device by means of a switch device, each of said active secondary power supply devices being configured to contribute on the value of the power supply voltage resulting at said output by a percentage different from the remaining active secondary power supply devices and all said active secondary power supply devices being configured as a whole to contribute on the value of said power supply voltage resulting at said output by a second predefined percentage (PP2) of the value of said nominal power supply voltage (Vnom), under the conditions of nominal current absorption, said second predefined percentage (PP2) being variable between zero and substantially twice said first pre-established percentage (PP1), said second predefined percentage (PP2) being determined by activating and/or deactivating each of said active secondary power supply devices by means of the relative switch device, each of said TDC devices being connected at the input to one of said power supply circuit modules, said power supply circuit modules receiving at the input said control signal (Vref).

8. A circuit architecture according to claim 7, further comprising a PLL device, said PLL device having its own output connected to said first input of each of said power supply circuit modules belonging to said circuit architecture.

9. A circuit architecture according to claim 7, comprising a PLL device provided with a power supply circuit module and a stabilisation circuit, said PLL device having its own output connected to a control input of each of said TDCs belonging to said circuit architecture, said stabilisation circuit having its own output connected to said first input of each of said power supply circuit modules belonging to said circuit architecture and said power supply circuit module (3015) having its own output connected in feedback to said stabilisation circuit.

10. A successive approximation calibration method of a power supply circuit module for a TDC (Time to Digital Converter) comprising:

a first input for receiving a control signal (Vref);

a second input for receiving a power supply voltage (Vdd);

an output configured to be connected to the power supply input of said TDC, said power supply circuit module being configured to deliver to said TDC a nominal power supply voltage value (Vnom) substantially dependent on said control signal (Vref);

an active main power supply device having its own output connected to said output, said active main power supply device being configured to receive said control signal (Vref) at the input and to contribute on the value of the power supply voltage resulting at said output by a voltage value lower than a first predefined percentage (PP1) with respect to said nominal power supply voltage (Vnom), under the conditions of nominal current absorption;

a number N of active secondary power supply devices configured to receive said control signal (Vref) at the input, each of said active secondary power supply devices having its own output connected in common with the outputs of the remaining N-1 active secondary power supply devices and with said output of said active main power supply device by means of a switch device, each of said active secondary power supply devices being configured to contribute on the value of the power supply voltage resulting at said output by a percentage different from the remaining active secondary power supply devices and all said active secondary power supply devices being configured as a whole to contribute on the value of said power supply voltage resulting at said output by a second predefined percentage (PP2) of the value of said nominal power supply voltage (Vnom), under the conditions of nominal current absorption, said second predefined percentage (PP2) being variable between zero and substantially twice said first pre-established percentage (PP1), said second predefined percentage (PP2) being determined by activating and/or deactivating each of said active secondary power supply devices by means of the relative switch device, the method comprising the steps of a) activating the active secondary power supply device among all said N active secondary power supply devices configured to contribute with a percentage more than the remaining N-1 active secondary power supply devices;

b) delivering to said TDC a start signal and a stop signal whose distance in time is equivalent to the period of a periodic reference signal (CLK) so as to deliver at the input to said TDC device a power supply voltage obtained from the contribution of said main power supply device and of said active secondary power supply device/devices activated;

c) verifying whether the digital value at the output from said TDC has exceeded the full scale or not;

d) in the affirmative case, activating also the active secondary power supply device configured to contribute on said resulting power supply voltage by a percentage lower than and closer to the percentage of contribution given by the last one of said active secondary power supply devices activated;

e) in the negative case, deactivating the last one of said active secondary power supply devices activated and activating the active secondary power supply device configured to contribute on said resulting power supply voltage by a percentage lower than and closer to the percentage of contribution given by said last one of said active secondary power supply devices activated;

f) repeating steps from b) to e) until all said N active secondary power supply devices are considered;

g) storing the activation and deactivation sequence of all the N active secondary power supply devices.

* * * * *